United States Patent
Takahashi

(10) Patent No.: US 7,376,164 B2
(45) Date of Patent: May 20, 2008

(54) VERTICAL CAVITY SURFACE EMITTING SEMICONDUCTOR LASER, LIGHT EMISSION DEVICE, AND OPTICAL TRANSMISSION SYSTEM

(75) Inventor: Takashi Takahashi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/560,247

(22) PCT Filed: Apr. 7, 2005

(86) PCT No.: PCT/JP2005/007269

§ 371 (c)(1),
(2), (4) Date: Nov. 29, 2006

(87) PCT Pub. No.: WO2005/101599

PCT Pub. Date: Oct. 27, 2005

(65) Prior Publication Data

US 2007/0071054 A1   Mar. 29, 2007

(30) Foreign Application Priority Data

Apr. 14, 2004   (JP) ............... 2004-118755

(51) Int. Cl.
*H01S 5/00* (2006.01)
(52) U.S. Cl. ............... 372/50.1; 372/50.11; 372/70
(58) Field of Classification Search ............... 372/50.1, 372/50.11, 70
See application file for complete search history.

(56) References Cited

U.S. PATENT DOCUMENTS

| | | | |
|---|---|---|---|
| 6,207,973 B1 | 3/2001 | Sato et al. | |
| 6,252,896 B1 | 6/2001 | Tan et al. | |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,657,233 B2 | 12/2003 | Sato et al. | |
| 6,674,785 B2 | 1/2004 | Sato et al. | |
| 6,765,232 B2 | 7/2004 | Takahashi et al. | |
| 6,829,271 B2 | 12/2004 | Sato et al. | |

(Continued)

FOREIGN PATENT DOCUMENTS

EP   1037341   9/2000

(Continued)

OTHER PUBLICATIONS

Connie J. Chang-Hasnain, "Injection-Locked VCSELs for Analog and Digital Communication Systems," Technical Report of IEICE, OPE2003-218, LQE2003-155 (Dec. 2003), pp. 25-27.

(Continued)

*Primary Examiner*—Dung T. Nguyen
(74) *Attorney, Agent, or Firm*—Dickstein Shapiro LLP

(57) ABSTRACT

A semiconductor laser is disclosed with which a VCSEL can be constituted with a simplified configuration for optical transmission at a transmission rate higher than 10 Gbps. The semiconductor laser includes a resonator including a first active region able to emit light in response to current injection and a second active region able to emit light in response to external excitation light. Multilayer film reflecting mirrors sandwich the resonator from two opposite sides. The first active region and the second active region generate light at a wavelength the same as the resonance mode of the resonator.

12 Claims, 5 Drawing Sheets

U.S. PATENT DOCUMENTS

| | | |
|---|---|---|
| 6,856,631 B1 | 2/2005 | Takahashi |
| 6,884,291 B1 | 4/2005 | Jikutani et al. |
| 6,959,025 B2 | 10/2005 | Jikutani et al. |
| 6,974,974 B2 | 12/2005 | Sato et al. |
| 6,983,004 B2 | 1/2006 | Jikutani et al. |
| 2002/0094004 A1 | 7/2002 | Furukawa |
| 2003/0053510 A1* | 3/2003 | Yuen et al. ............ 372/96 |
| 2004/0101008 A1* | 5/2004 | Kurtz et al. ............ 372/39 |
| 2004/0228381 A1 | 11/2004 | Jikutani et al. |
| 2004/0233953 A1 | 11/2004 | Sato |
| 2004/0238832 A1 | 12/2004 | Takahashi et al. |
| 2005/0040413 A1 | 2/2005 | Takahashi et al. |

FOREIGN PATENT DOCUMENTS

| | | |
|---|---|---|
| JP | 07-249824 | 9/1995 |
| JP | 11-307876 | 11/1999 |
| JP | 11-307880 | 11/1999 |
| JP | 2000-261096 | 9/2000 |
| JP | 2000-307195 | 11/2000 |
| JP | 2001-358403 | 12/2001 |
| JP | 2002-185079 | 6/2002 |
| JP | 2002-204039 | 7/2002 |
| JP | 2002-217491 | 8/2002 |
| JP | 2003-283051 | 10/2003 |
| JP | 2004-103754 | 4/2004 |

OTHER PUBLICATIONS

Yukihiro Hayashi et al., "A Study on Modulation Instability in Optical Fiber Links with Random Birefringence," Technical Report of IEICE, LQE2003-15 (May 2003), pp. 57-60.

Knodl et al., "Three-Terminal Dual-Stage Vertical-Cavity Surface-Emitting Laser" Electronics Letters, vol. 38, No. 6, pp. 278-280, Mar. 14, 2002.

Spilios Riyopoulos, "Elimination of Transient Vertical-Cavity Surface-Emitting Laser Oscillations Using Photoactive Feedback" Applied Physics Letters, vol. 75, No. 20, pp. 3057-3059, Nov. 15, 1999.

* cited by examiner

VERTICAL CAVITY SURFACE EMITTING SEMICONDUCTOR LASER, LIGHT EMISSION DEVICE, AND OPTICAL TRANSMISSION SYSTEM

TECHNICAL FIELD

The present invention relates to a semiconductor laser, and particularly, a vertical cavity surface emitting laser device, and a light emission device and an optical transmission system.

BACKGROUND ART

In these years, the optical transmission technique is widely used not only in major transmission networks but also in LANs (Local Area Networks), home networks, or access systems. For example, in Ethernet, a transmission rate of 10 Gbps has been obtained, a higher transmission rate will be required in the near future, and an optical transmission system is expected to provide a transmission capacity higher than 10 Gbps.

In a light source used in optical transmission having a transmission rate lower than 10 Gbps, a direct modulation scheme is primarily employed in which the power of output light is modulated by modulating an injection current flowing in a semiconductor laser. However, it is difficult to operate a semiconductor laser at a modulation frequency higher than 10 GHz with the direct modulation scheme.

To solve this problem, a modulation scheme has been developed in which light output from a semiconductor laser is modulated by an external modulator. However, in this external modulation scheme, size of modules is large, and a large number of parts are used; hence, cost is high. For this reason, even though an optical transmission technique using an external modulator is applied in expensive systems such as major transmission networks, it is not suitable for personal systems, such as LANs or home networks.

On the other hand, it has been studied to use a vertical cavity surface emitting laser (VCSEL) as a light source used in LANs or for optical interconnections. The VCSEL has low power consumption compared to traditional edge-emitting lasers, and because cleavage is not needed during the fabrication process, it is possible to inspect the device in wafer form, hence the fabrication cost can be reduced. For this reason, it is expected to use a vertical cavity surface emitting laser (VCSEL) by means of direct modulation as a light source in LANs or for optical interconnections involving a transmission capacity higher than 10 Gbps.

The following methods have been proposed to perform fast speed modulation for the VCSEL.

Japanese Laid-Open Patent Application No. 2002-185079 (referred to as "reference 1" hereinafter) discloses a technique in which a current is injected into an active region without passing through an upper multilayer reflecting mirror, and a modulation doped stacked structure able to generate two-dimensional carriers is provided so as to reduce a lateral resistance, and this reduces the resistance of the VCSEL and spreads an electrical modulation region, which is restricted by a resistance R and a capacitance C.

Japanese Laid-Open Patent Application No. 2002-204039 (referred to as "reference 2" hereinafter) discloses a technique in which a quantum well layer capable of intersubband absorption is arranged near a light emission layer; when modulated optical signals are input, due to the intersubband absorption of the quantum well layer, a carrier distribution, a carrier density of the light emission layer, and light emission output are modulated; as a result, high speed is obtainable with the response speed not being influenced by a CR time constant or a carrier transportation effect.

Japanese Laid-Open Patent Application No. 7-249824 (referred-to as "reference 3" hereinafter) discloses a technique in which horizontal cavity semiconductor lasers for optically exciting a VCSEL are stacked on the same substrate, a forbidden band width of an active layer of the VCSEL is set to be less than a forbidden band width of the horizontal cavity semiconductor lasers to increase optical excitation efficiency, and modulation optical signals from the horizontal cavity semiconductor lasers are input for external modulation; thereby, the modulation frequency of the VCSEL is increased.

In IEICE technical report, Optoelectronics 2003-218, LQE3003-155 (referred to as "reference 4" hereinafter), a technique is disclosed in which a DFB laser beam is injected into a VCSEL and is synchronized with an oscillation wavelength of the VCSEL (this is the so-called "injection lock"); due to this, a relaxation oscillation frequency of the VCSEL is increased to be 22.8 GHz.

As described above, in reference 1, response speed is improved when electrical modulation signals output from a driver circuit modulate the carrier density of the light emission layer of the VCSEL. In references 2 and 3, the optical modulation signals are input from outside to reduce influence of a delay of an electrical response speed when a current flows into the device.

However, none of the techniques in references 1, 2 and 3 can increase the relaxation oscillation frequency, which represents a frequency at which the speed of induced emission can no longer follow the change of the carrier density in the light emission layer. Due to this, the modulation speed is limited by the relaxation oscillation frequency.

In reference 4, a laser beam is injected from outside and is synchronized with the oscillation mode of the VCSEL; thereby, the photon density inside the VCSEL is increased. Since the internal photon density is associated with the relaxation oscillation frequency, by increasing the internal photon density, the relaxation oscillation frequency of the VCSEL can be increased. However, in the technique shown in reference 4, it is necessary to accurately set the wavelength of the laser beam injected from outside to be exactly equal to the wavelength of the oscillation mode of the VCSEL. Even when the wavelength deviates by only a few nanometers to be out of synchronization, it is impossible to increase the relaxation oscillation frequency of the VCSEL. For this reason, devices for tuning the wavelength and for temperature control are required, thus the overall device become complicated.

DISCLOSURE OF THE INVENTION

It is a general object of the present invention to solve one or more of the problems of the related art.

A specific object of the present invention is to provide a semiconductor laser that can be used to form a VCSEL (vertical cavity surface emitting laser) light emission device with a simplified configuration, the VCSEL light emission device being used in optical transmission at a transmission rate higher than 10 Gbps per channel, and a light emission device, and an optical transmission system.

According to a first aspect of the present invention, there is provided a vertical cavity surface emitting semiconductor laser, comprising: a resonator that is arranged on a substrate and includes a first active region able to emit light in response to injection of an electrical current therein and a second active region able to emit light in response to external excitation light; and plural multilayer film reflecting mirrors that sandwich the resonator from two opposite sides, respectively, wherein both the first active region and the second active region have gains at a wavelength the same as a resonance mode of the resonator.

According to the present invention, in addition to a first active region able to emit light in response to injection of an electrical current, a second active region is provided in the resonator which is able to emit light in response to external excitation light. As a result, the photon density generated due to the external excitation light is added to the photon density generated due to injection of an electrical current at the same mode, and the total photon density in the vertical cavity surface emitting semiconductor laser is increased. Due to this, it is possible to increase a relaxation oscillation frequency of the vertical cavity surface emitting semiconductor laser, and attain high speed modulation.

According to a second aspect of the present invention, there is provided a vertical cavity surface emitting semiconductor laser, comprising: a plurality of resonators that are arranged on a substrate and optically coupled with each other to form a resonance mode, one of the resonators having a first active region able to emit light in response to injection of an electrical current, each of the other resonators having a second active region able to emit light in response to external excitation light; and plural multilayer film reflecting mirrors that sandwich the resonators from two opposite sides, respectively, wherein the first active region and the second active regions have gains at a wavelength the same as the resonance mode.

According to the present invention, the vertical cavity surface emitting semiconductor laser includes plural resonators optically coupled with each other, one of the resonators has a first active region able to emit light in response to injection of an electrical current, and each of the other resonators has a second active region able to emit light in response to external excitation light. As a result, the photon density generated due to the external excitation light is added to the photon density generated due to injection of an electrical current at the same mode, and the total photon density in the vertical cavity surface emitting semiconductor laser is increased. Therefore, it is possible to increase the relaxation oscillation frequency of the vertical cavity surface emitting semiconductor laser and attain high speed modulation.

In addition, because the first active region and the second active region are separated from each other, it is possible to prevent optical crosstalk from the external excitation light.

As an embodiment, plural second active regions are provided.

According to the present invention, because plural second active regions are provided, gain saturation can hardly occur even at a high photon density, therefore, it is possible to further increase the relaxation oscillation frequency of the vertical cavity surface emitting semiconductor laser.

As an embodiment, each of the first active region and the second active regions includes a mixed crystalline semiconductor of nitrogen and group-V elements.

According to the present invention, because each of the first active region and the second active regions includes a mixed crystalline semiconductor of nitrogen and group-V elements, it is possible to form a vertical cavity surface emitting semiconductor laser operating at a wavelength of 1.31 μm, at which dispersion of a silica optical fiber is zero, and form a light emission device suitable for high data rate transmission.

As an embodiment, the first active region includes a multiple quantum well structure obtained by stacking plural quantum well layers and barrier layers, and each of the barrier layers is doped with p-type impurities at a concentration in a range from $1 \times 10^{18}$ cm$^{-3}$ to $1 \times 10^{19}$ cm$^{-3}$.

According to the present invention, because the first active region includes a multiple quantum well structure obtained by stacking plural quantum well layers and barrier layers, and each of the barrier layers is doped with p-type impurities at a concentration in a range from $1 \times 10^{18}$ cm$^{-3}$ to $1 \times 10^{19}$ cm$^{-3}$, it is possible to increase the relaxation oscillation frequency of the vertical cavity surface emitting semiconductor laser.

According to a third aspect of the present invention, there is provided a light emission device, comprising: an external excitation light source, and a vertical cavity surface emitting semiconductor laser that includes a resonator that is arranged on a substrate and includes a first active region able to emit light in response to injection of an electrical current therein and a second active region, able to emit light in response to external excitation light, the first active region and the second active region having gains at a wavelength the same as a resonance mode of the resonator, and plural multilayer film reflecting mirrors that sandwich the resonator from two opposite sides, respectively, wherein a wavelength of the external excitation light source is less than or equal to a wavelength corresponding to a bandgap of the second active region.

According to the present invention, it is possible to realize high data rate optical transmission over 10 Gbps.

As an embodiment, the external excitation light source is a semiconductor laser.

According to the present invention, because the external excitation light source is a semiconductor laser, it is possible to make the light emission device compact and reduce power consumption.

As an embodiment, the external excitation light source is a vertical cavity surface emitting semiconductor laser.

According to the present invention, because the external excitation light source is a vertical cavity surface emitting semiconductor laser, it is possible to further reduce power consumption of the light emission device and reduce cost of the light emission device.

As an embodiment, the external excitation light source and the vertical cavity surface emitting semiconductor laser are integrated together.

According to the present invention, because the external excitation light source and the vertical cavity surface emitting semiconductor laser are integrated together, it is possible to make the light emission device compact, reduce the number of parts in the light emission device, and reduce cost of the light emission device.

According to a fourth aspect of the present invention, there is provided a light emission device comprising: an external excitation light source; and a vertical cavity surface emitting semiconductor laser that includes a plurality of resonators that are arranged on a substrate and optically coupled with each other to form a resonance mode, one of the resonators having a first active region able to emit light in response to injection of an electrical current, each of the other resonators having a second active region able to emit light in response to external excitation light; and a plurality of multilayer film reflecting mirrors which mirrors sandwich the resonators from two opposite sides, respectively; wherein the first active region and the second active regions have gains at a wavelength the same as the resonance mode.

According to a fifth aspect of the present invention, there is provided an optical transmission system, comprising: a light emission device, which includes an external excitation light source, and a vertical cavity surface emitting semiconductor laser wherein the vertical cavity surface emitting semiconductor laser includes a resonator that is arranged on a substrate and includes a first active region able to emit light in response to injection of an electrical current therein and a second active region able to emit light in response to external excitation light, the first active region and the second active region having gains at a wavelength the same as the resonance mode of the resonator, and plural multilayer film reflecting mirrors that sandwich the resonator from two opposite sides, respectively, wherein a wavelength of the external excitation light source is less than or equal to a wavelength corresponding to a bandgap of the second active region.

According to a sixth aspect of the present invention, there is provided an optical transmission system, comprising a light emission device, which includes an external excitation light source; and a vertical cavity surface emitting semiconductor laser, which includes a plurality of resonators that are arranged on a substrate and optically coupled with each other to form a resonance mode, one of the resonators having a first active region able to emit light in response to injection of an electrical current, each of the other resonators having a second active region able to emit light in response to external excitation light; and a plurality of multilayer film reflecting mirrors which mirrors sandwich the resonators from two opposite sides, respectively; wherein the first active region and the second active regions have gains at a wavelength the same as the resonance mode.

According to the present invention, it is possible to construct an optical transmission system for high data rate optical transmission over 10 Gbps at low cost.

These and other objects, features, and advantages of the present invention will become more apparent from the following detailed description of preferred embodiments given with reference to the accompanying drawings

BEST MODE FOR CARRYING OUT THE INVENTION

Figure 1:
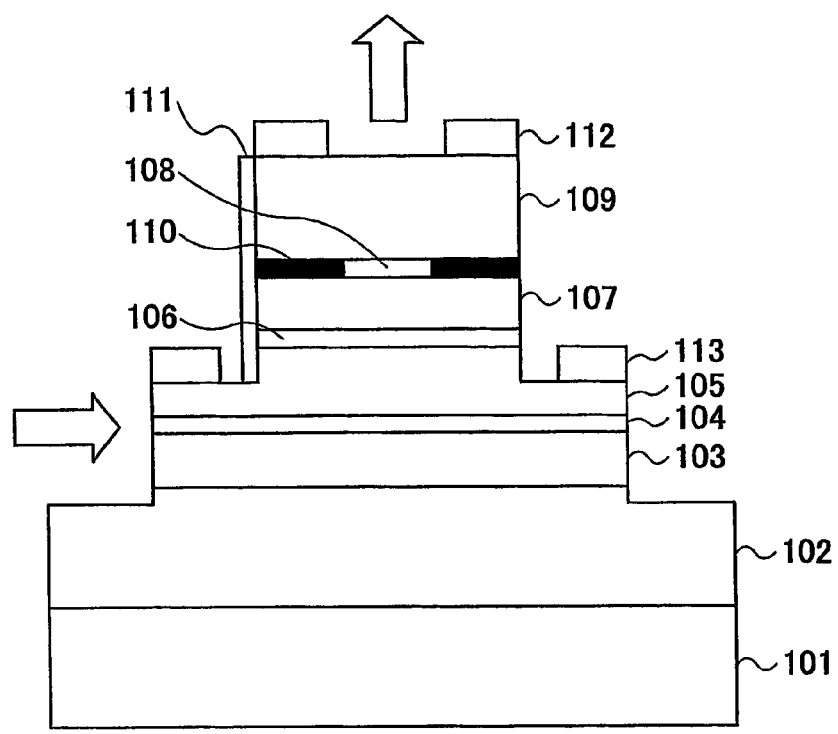
FIG. 1 is a schematic cross-sectional view illustrating an example of the vertical cavity surface emitting semiconductor laser (VCSEL) according to the present invention.

Below, preferred embodiments of the present invention are explained with reference to the accompanying drawings.

First Embodiment

The present embodiment relates to a vertical cavity surface emitting semiconductor laser, which includes a resonator arranged on a substrate, and multilayer film reflecting mirrors sandwiching the resonator from two opposite sides, respectively. The resonator includes a first active region that is able to emit light in response to injection of an electrical current, and a second active region that is able to emit light in response to external excitation light. Both the first active region and the second active region have gains at a wavelength the same as a resonance mode of the resonator.

In direct modulation of a semiconductor laser, a few factors may impose limitations on the modulation bands, for example, a CR time constant, a carrier transportation effect, or a relaxation oscillation frequency. Especially, the relaxation oscillation frequency indicates a limiting frequency at which the speed of induced emission can no longer follow the change of carrier density in the light emission layer, and it imposes an intrinsic limitation on the direct modulation.

Generally, the relaxation oscillation frequency fr can be expressed by the following formula (1).

$$fr = \frac{1}{2\pi}\sqrt{\frac{\Gamma g S}{\tau_p}} \quad (1)$$

where, $\Gamma$ represents an optical confinement coefficient, g represents differential gain, S represents photon density, and $\tau_p$ represents photon lifetime.

According to the formula (1), the relaxation oscillation frequency fr increases along with the photon density S. However, if carriers are highly injected into the light emission layer, gain saturation occurs because of carrier overflow or heating of the laser device, and the photon density cannot be increased any more. For this reason, the relaxation oscillation frequency fr is limited to about 10 GHz.

In the vertical cavity surface emitting semiconductor laser of the present embodiment, in addition to the first active region being able to emit light in response to injection of an electrical current, the resonator also includes the second active region which is able to emit light in response to external excitation light, but without a current injection mechanism. As a result, by modulating an injection current flowing in the first active region, the carrier density in the first active region changes, and the intensity of output light is modulated. Further, in the second active region, light emission is induced by continuous injection of the external excitation light, and when the intensity of the excitation light is increased to be over a specified threshold value, laser oscillation occurs.

The first active region, which emits light in response to injection of an electrical current, and the second active region, which emits light in response to external excitation light, are provided in the same resonator, and both the first active region and the second active region have gains at a wavelength the same as the resonance mode of the resonator. Therefore, light emission due to oscillation in the first active region caused by current injection and light emission due to oscillation in the second active region caused by external excitation light are at the same oscillation frequency, that is, their oscillation modes are synchronized with each other.

Hence, the photon density generated by the external excitation light is added at the same mode to the photon density generated by current injection, while in the related art only the photon density generated by current injection is present. Therefore, the photon density S in the laser device can be increased, and it is possible to increase the relaxation oscillation frequency fr of the vertical cavity surface emitting semiconductor laser (VCSEL), and attain high speed modulation.

For example, the external excitation light can be injected in a lateral direction of the VCSEL, or in a direction perpendicular to the substrate.

In the VCSEL disclosed in the above mentioned reference 4, a laser beam synchronized with an oscillation mode of the VCSEL is injected into the VCSEL from outside, thereby increasing the photon density inside the VCSEL. For this purpose, it is necessary to accurately set the wavelength of the laser beam injected from the outside to be exactly equal to the wavelength of the oscillation mode of the VCSEL.

In contrast, in the present embodiment, because the external excitation light, that is, the laser beam injected from the outside, is used to optically excite the second active region, the external excitation light can have any wavelength provided that the external excitation light can be absorbed by the second active region. Hence, it is not necessary to accurately control the wavelength of the excitation light, and this makes the structure of the laser device simple.

The technique disclosed in the aforementioned reference 3 is similar to the present embodiment in the aspect that a light beam is injected to excite the VCSEL, but it is different from the present embodiment in the aspect that an active layer into which a current is injected and an active layer into which the light beam is injected are in the same layer.

When the current injection active layer and the light injection active layer are in the same layer, because the carriers generated due to light excitation are added to the carrier density generated due to current injection, it is difficult to improve the gain saturation caused by carrier overflow in the active layer.

In contrast, in the present embodiment, because the first active region, which emits light in response to current injection, and the second active region, which emits light in response to external excitation light, are separated from each other, it is possible to prevent carrier storage in the first active region, into which a current is injected, and to increase the photon density inside the VCSEL. As a result, it is possible to increase the relaxation oscillation frequency compared to the related art.

In addition, in Electronics Letters, 2002, Vol. 28, pp. 278-280 (referred to as "reference 5", hereinafter), a VCSEL structure is disclosed which includes two active regions in the resonator. The VCSEL structure in reference 5 has three terminals, and electrical currents are injected into the two active regions independently. However, if current injection active regions are close to each other, a junction voltage is applied on the pn junction of each of the active regions, and heat generated in the VCSEL is large.

In contrast, in the present embodiment, one of the two active regions is optically excited for light emission, but does not have a current injection mechanism; hence, heat generation in the VCSEL can be reduced.

Because a pn junction is not formed in the second active region, which is excited by external excitation light and emits light, the second active region can be formed in any of a n-type semiconductor layer, a p-type semiconductor layer, or a non-doped semiconductor layer, thereby, increasing the degree of freedom when designing the VCSEL structure.

It is desirable that the first active region and the second active region be at anti-node positions of an optical standing wave distribution in the VCSEL device. Due to this, coupling efficiency between the optical standing wave and the active region can be improved, and a threshold can be lowered.

In order to improve temperature characteristics of the VCSEL device, the wavelength at the peak of the gain of the active region at room temperature can be shifted to the short wavelength side relative to the oscillation mode wavelength. When shifting the wavelength, it is not required to set the wavelength shift of the first active region to be equal to the wavelength shift of the second active region. It is sufficient if the oscillation mode wavelength is within the gain spectrum band of each of the active regions.

Second Embodiment

The present embodiment relates to a vertical cavity surface emitting semiconductor laser, which includes plural resonators arranged on a substrate and optically coupled with each other to form a resonance mode, and plural multilayer film reflecting mirrors sandwiching the resonators from two opposite sides, respectively. One of the resonators has a first active region able to emit light in response to injection of an electrical current, and each of other resonators has a second active region able to emit light in response to external excitation light. The first active region and the second active regions have gains at a wavelength of the same resonance mode.

According to the present embodiment, the vertical cavity surface emitting semiconductor laser includes plural resonators optically coupled with each other, one of the resonators has a first active region able to emit light in response to injection of an electrical current, and each of the other resonators has a second active region able to emit light in response to external excitation light.

As a result, by modulating an injection current flowing in the first active region, the carrier density in the first active region changes, and the intensity of output light is modulated. Further, in the second active region, induced emission is caused by continuous injection of the external excitation light, and when the intensity of the excitation light is increased to be over a specified threshold value, laser oscillation occurs.

In the present embodiment, the first active region, which emits light in response to injection of an electrical current, and the second active region, which emits light in response to external excitation light, are provided in different resonators, but these resonators optically couple with each other and form a resonance mode. In addition, the first active region and the second active regions have gains at a wavelength the same as the resonance mode. Therefore, light emission due to oscillation in the first active region caused by current injection and light emission due to oscillation in the second active region caused by external excitation light are at the same oscillation frequency, that is, their oscillation modes are synchronized with each other.

Hence, the photon density generated by the external excitation light is added at the same mode to the photon density generated due to current injection. In contrast, in the related art, only the photon density generated by current injection is present. Therefore, the photon density in the VCSEL device is increased, and it is possible to increase the relaxation oscillation frequency fr of the VCSEL device, and attain high speed modulation.

Because the first active region, which is excited by current injection and emits light, and the second active region, which is excited by external excitation light and emits light, are provided in different resonators, the first active region and the second active region are separated from each other.

It is known that when the first active region and the second active region are arranged to be close to each other, a portion of the excitation light injected from the outside is also injected into the first active region, and results in an increase of the carrier density in the first active region.

In contrast, in the present embodiment, because the first active region and the second active region are separated from each other, the excitation light injected from the outside is only injected into the second active region, therefore, it is possible to prevent leakage of the excitation light into the first active region and prevent optical crosstalk from the external excitation light.

Third Embodiment

The present embodiment relates to a vertical cavity surface emitting semiconductor laser, which includes plural second active regions that are excited by external excitation light and emit light, in addition to the structure as described in one of the first embodiment and the second embodiment.

According to the present embodiment, because of an increased number of active regions able to generate gains, it is possible to reduce density of the carriers stored in the active regions so that gain saturation can hardly occur even at a high photon density. Therefore, it is possible to further increase the relaxation oscillation frequency of the vertical cavity surface emitting semiconductor laser.

The plural active regions are excited by external excitation light, but do not have current injection mechanisms. It is known that if there are plural current injection active regions, it is necessary to increase the number of electrode terminals, and this makes the structure of the device complicated. Due to this complication, the number of steps in the fabrication process increases, and the yield decreases.

It is desirable that the second active regions be located at anti-node positions of an optical standing wave distribution in the VCSEL device. Due to this, it is possible to easily increase the number of the second active regions, and to reduce cost.

Usually, the second active regions, which are excited by external excitation light, emit light, and do not have current injection mechanisms, are provided in a resonator sandwiched by distributed Bragg reflection mirrors (DBR). However, the second active regions may be provided in the DBR. This is because light may leak out of the resonator to the DBR side, and this light can be strengthened in the second active regions provided in the DBR. However, the light intensity at anti-node positions of the optical standing wave distribution in the VCSEL device is attenuated when the distance to the resonator is far; hence, the coupling efficiency between light in the VCSEL device and the active layers decreases. For this reason, when the second active regions, which are excited by external excitation light, emit light, and do not have current injection mechanisms, are provided in the DBR, it is desirable that the second active regions be arranged within a distance to the resonator less than three periods.

Fourth Embodiment

The present embodiment relates to a vertical cavity surface emitting semiconductor laser, wherein each active region includes a mixed crystalline semiconductor of nitrogen and group-V elements, in addition to the structure as described in one of the first embodiment through the third embodiment.

The mixed crystalline semiconductor materials of nitrogen and group-V elements may include GaNAs, GaInNAs, GaNAsP, GaInNAsP, GaNAsSb, GaInNAsSb, GaNAsPSb, GaInNAsPSb. These mixed crystalline semiconductor materials belong to long-wavelength material groups which are capable of crystal growth on a GaAs substrate. Below, GaInNAs is taken as an example for descriptions.

Because GaInNAs can have a conduction band electron confinement barrier height as high as 300 meV or even higher relative to a barrier height of GaAs, GaInNAs is able to prevent electron overflow and has good temperature characteristics.

In addition, because a distributed Bragg reflection mirror is usable, which is formed from AlGaAs-based materials, and has high reflectivity and high thermal conductivity, a vertical cavity surface emitting semiconductor laser can be constructed which has high performance in the long-wavelength band.

As described above, the object of the present invention is to provide a direct modulation VCSEL able to improve the modulation frequency and thereby enabling high data rate optical transmission over 10 Gbps. At transmission rates higher than 10 Gbps, because of dispersion in a silica optical fiber, the transmission distance is limited. By forming the first active region and the second active region with mixed crystalline semiconductors of nitrogen and group-V elements, such as GaInNAs, it is possible to form a vertical cavity surface emitting semiconductor laser operating at a wavelength of 1.31 μm, at which dispersion in a silica optical fiber is zero, and this allows one to take full advantage of high speed modulation of the present invention.

Fifth Embodiment

The present embodiment relates to a vertical cavity surface emitting semiconductor laser, wherein the first active region that is excited by current injection for light emission includes a multiple quantum well (MQW) structure formed by stacking plural quantum well layers and barrier layers, and each of the barrier layers is doped with p-type impurities at a concentration in a range from $1 \times 10^{18}$ cm$^{-3}$ to $1 \times 10^{19}$ cm$^{-3}$, in addition to the structure as described in one of the first embodiment through the fourth embodiment.

In the present embodiment, because the barrier layers in the multiple quantum well (MQW) structure are doped with p-type impurities at a concentration in a range from $1 \times 10^{18}$ cm$^{-3}$ to $1 \times 10^{19}$ cm$^{-3}$, it is possible to reduce the density of electrons required to be injected for laser oscillation, and to increase the differential gain g. According to the afore mentioned formula (1), by combining the effect of increasing the differential gain g and the effect of increasing the photon density S in the VCSEL device, it is possible to further increase the relaxation oscillation frequency of the VCSEL device.

When the concentration of the p-type impurities is less than $1\times10^{18}$ cm$^{-3}$, little increase of the differential gain g can be obtained. Meanwhile, when the concentration of the p-type impurities is greater than $1\times10^{19}$ cm$^{-3}$, crystallinity of the barrier layers degrades. Therefore, it is desirable that the p-type impurities be doped at a concentration in a range from $1\times10^{18}$ cm$^{-3}$ to $1\times10^{19}$ cm$^{-3}$.

The p-type impurities may include C, Zn, Be, Mg; C is preferable because thermal diffusion of C is small even at high doping concentration, hence a sharp doping profile is obtainable.

Sixth Embodiment

The present embodiment relates to a light emission device, which includes a vertical cavity surface emitting semiconductor laser as described in one of the first embodiment through the fifth embodiment, and an external excitation light source, wherein the wavelength of the external excitation light source is less than or equal to a wavelength corresponding to a bandgap of a second active region that is excited by external excitation light for light emission.

According to the present embodiment, the light emission device includes a vertical cavity surface emitting semiconductor laser as described in one of the first embodiment through the fifth embodiment, and an external excitation light source, where the external excitation light source emits light having a wavelength less than or equal to a wavelength corresponding to the bandgap of the second active region. Due to this configuration, the second active region, which does not have a current injection mechanism, is excited by external excitation light for light emission. By using the modulation signal as the electrical signal that ought to be applied to the first active region, which is excited by current injection for light emission, the light output of the VCSEL is modulated.

The relaxation oscillation frequency of the VCSEL increases along with increase of the photon density in the VCSEL of light generated by oscillation induced by the external excitation light. With a VCSEL having a higher relaxation oscillation frequency, the light emission device of the present embodiment is capable of high speed modulation, and this enables high data rate optical transmission over 10 Gbps.

Seventh Embodiment

The present embodiment relates to a light emission device the same as the light emission device in the sixth embodiment, and furthermore, the external excitation light source is a semiconductor laser in the present embodiment.

According to the present embodiment, because the external excitation light source is a semiconductor laser, it is possible to make the light emission device compact and reduce power consumption.

The semiconductor laser used as the external excitation light source can be a Fabry-Perot resonating semiconductor laser, a distributed feedback (DFB) laser, or a distributed Bragg reflection semiconductor laser.

Eighth Embodiment

The present embodiment relates to a light emission device the same as the light emission device in the sixth embodiment; furthermore, the external excitation light source is a vertical cavity vertical cavity surface emitting semiconductor laser (VCSEL).

The VCSEL has low power consumption compared to an edge-emitting laser, and can be fabricated at low cost. Therefore, with the external excitation light source being the VCSEL, it is possible to further reduce power consumption and fabrication cost of the light emission device.

Ninth Embodiment

The present embodiment relates to a light emission device the same as the light emission device in the seventh embodiment or the eighth embodiment; furthermore, the vertical cavity surface emitting semiconductor laser as described in one of the first embodiment through the fifth embodiment and the external excitation light source are integrated together.

According to the present embodiment, because the external excitation light source and the vertical cavity surface emitting semiconductor laser are integrated together, it is possible to further reduce size of the light emission device, reduce the number of parts in the light emission device, and lower the cost of the light emission device.

In addition, when an edge emitting semiconductor laser is used as the external excitation light source, the VCSEL and edge emitting semiconductor laser can be arranged side by side to form a structure enabling optical excitation in the lateral direction. Further, when a vertical cavity surface emitting semiconductor laser (VCSEL) is used as the external excitation light source, the VCSEL for outputting modulation light and the VCSEL for optical excitation can be stacked in a direction perpendicular to the substrate.

Meanwhile, Electronics Letters, 1998, Vol. 34, pp. 1405-1407 (referred to as "reference 6", hereinafter) discloses a stacked structure formed-by stacking a VCSEL at a wavelength of 0.85 µm for used of optical excitation and a VCSEL at a wavelength of 1.3 µm. In reference 6, however, the VCSEL at the 1.3 µm band does not have a current injection mechanism, and modulation of the light at 1.3 µm is carried out by the VCSEL at 0.85 µm by means of direct modulation. For this reason, the modulation frequency is limited to the relaxation oscillation frequency of the VCSEL at 0.85 µm. Therefore, different from the present invention, this structure in reference 6 cannot increase the relaxation oscillation frequency of the VCSEL itself. Namely, the technique in reference 6 is different from the present embodiment in both structure and operating principle.

10th Embodiment

The present embodiment, relates to an optical transmission system, which includes a light emission device as described in one of the sixth embodiment through the ninth embodiment.

According to the present embodiment, it is possible to perform high speed modulation over 10 GHz by direct modulation of a VCSEL. Due to this, it is possible to construct an optical transmission system for high data rate optical transmission over 10 Gbps at low cost without external modulators or electron cooling devices.

EXAMPLE 1

FIG. 1 is a schematic cross-sectional view illustrating an example of the vertical cavity surface emitting semiconductor laser (VCSEL) according to the present invention.

As illustrated in FIG. 1, a non-doped distributed Bragg reflection mirror (DBR) 102 is disposed on a semi-insulating GaAs substrate 101.

The non-doped distributed Bragg reflection mirror (DBR) 102 is formed by alternately stacking a non-doped $Al_{0.2}Ga_{0.8}As$ layer and a non-doped $Al_{0.9}Ga_{0.1}As$ layer, each of which has a thickness of ¼ wavelength.

In addition, a first spacer layer 103 formed from $Al_{0.3}Ga_{0.7}As$, a multiple quantum well active region 104 formed from $GaAs/Al_{0.3}Ga_{0.7}As$, acting as the second active region, a second spacer layer 105 formed from n-type $Al_{0.3}Ga_{0.7}As$, a multiple quantum well active region 106 formed from $GaAs/Al_{0.3}Ga_{0.7}As$, acting as the first active region, a third spacer layer 107 formed from $Al_{0.3}Ga_{0.7}As$, a p-type AlAs layer 108, and a p-type DBR 109 are stacked sequentially on the non-doped distributed Bragg reflection mirror (DBR) 102.

Here, the p-type DBR 109 is formed by alternately stacking a p-type $Al_{0.2}Ga_{0.8}As$ layer and a p-type $Al_{0.9}Ga_{0.1}As$ layer, each of which has a thickness of ¼ wavelength.

The stacked structure is etched from the top surface thereof up to the middle of the second spacer layer 105 to make the etched portion of the stacked structure a cylindrical shape, thereby forming a first mesa structure. In addition, the stacked structure is further etched up to the non-doped distributed Bragg reflection mirror (DBR) 102 to make the etched portion of the stacked structure a cylindrical shape, thereby forming a second mesa structure larger than the first mesa structure.

The p-type AlAs layer 108 is selectively oxidized from a side surface of the first mesa structure, thereby, forming an $AlO_x$ insulating region 110.

A p-side ring electrode 112 is formed on the p-type DBR 109 except a light outgoing portion, and an n-side electrode 113 is formed on the bottom of the first mesa structure (the top of the second mesa structure). A light-shielding layer 111 is arranged on the side surface of the first mesa structure. For example, the light-shielding layer 111 may be metal with an insulating layer.

In the VCSEL illustrated in FIG. 1, holes injected from the p-side ring electrode 112 and electrons injected from the n-side electrode 113 recombine and result in light emission in the multiple quantum well first active region 106 formed from $GaAs/Al_{0.3}Ga_{0.7}As$, which emitted light is at a wavelength of 0.85 μm. At this moment, since the current is blocked by the $AlO_x$ insulating region 110, the current is concentrated beneath the portion of the p-type AlAs layer 108 not being selectively oxidized; hence the current distribution is narrowed.

The light emitted from the first active region 106 resonates in the resonator between the non-doped distributed Bragg reflection mirror (DBR) 102 and the p-type DBR 109, and a laser beam is emitted upward perpendicular to the substrate.

According to the present embodiment, the VCSEL includes the multiple quantum well second active region 104 formed from $GaAs/Al_{0.3}Ga_{0.7}As$, in addition to the multiple quantum well first active region 106 formed from $GaAs/Al_{0.3}Ga_{0.7}As$, which emits light due to current injection.

The multiple quantum well second active region 104 does not have an electrode for injecting a current. Instead, a window for injecting external excitation light from the side surface of the second active region 104 is provided on the side surface of the second mesa structure. In addition, the light-shielding layer 111 arranged on the side surface of the first mesa structure has the function of preventing the first active region 106 from being irradiated by the external excitation light.

With the excitation light being continuously injected from the outside to the second active region 104, light is emitted from the second active region 104 having a wavelength corresponding to a bandgap of the second active region 104 at 0.85 μm. When the intensity of the excitation light is increased to be over a specified threshold value, externally-excited laser oscillation occurs in the VCSEL.

Because the first active region 106 has the same bandgap as the second active region 104, and the laser oscillation occurs in the same resonator formed between the non-doped distributed Bragg reflection mirror (DBR) 102 and the p-type DBR 109, the light generated by oscillation induced by current injection into the first active region 106 and the light generated by oscillation induced by optically exciting the second active region 104 have the same wavelength.

With the excitation light being continuously injected into the second active region 104 to induce oscillation in the second active region 104, by modulating the injection current flowing in the first active region 106, the carrier density in the first active region 106 changes, and the intensity of the output laser is modulated. Therefore, the photon density in the second active region 104 generated by the external excitation light is added at the same mode to the photon density generated in the first active region 106 by current injection. Hence, the photon density in the VCSEL can be increased, and it is possible to increase the relaxation oscillation frequency fr of the VCSEL, and attain high speed modulation.

Because the first active region 106, which is excited by current injection, and the second active region 104, which is excited by external excitation light, are separated from each other, the photon density in the VCSEL can be increased with a relatively low carrier density in the first active region 106. Hence, it is possible to prevent gain saturation induced by carrier overflow in the first active region 106 into which a current is injected. Therefore, it is possible to increase the relaxation oscillation frequency fr of the VCSEL, and attain high speed modulation.

The external excitation light injected into the second active region 104 can have any wavelength provided that the external excitation light can be absorbed by the second active region 104. Hence, it is not necessary to accurately control the wavelength of the excitation light; thus, it is not necessary to tune the wavelength of the excitation light or to control the temperature, and this makes the control easy.

EXAMPLE 2

Figure 2:
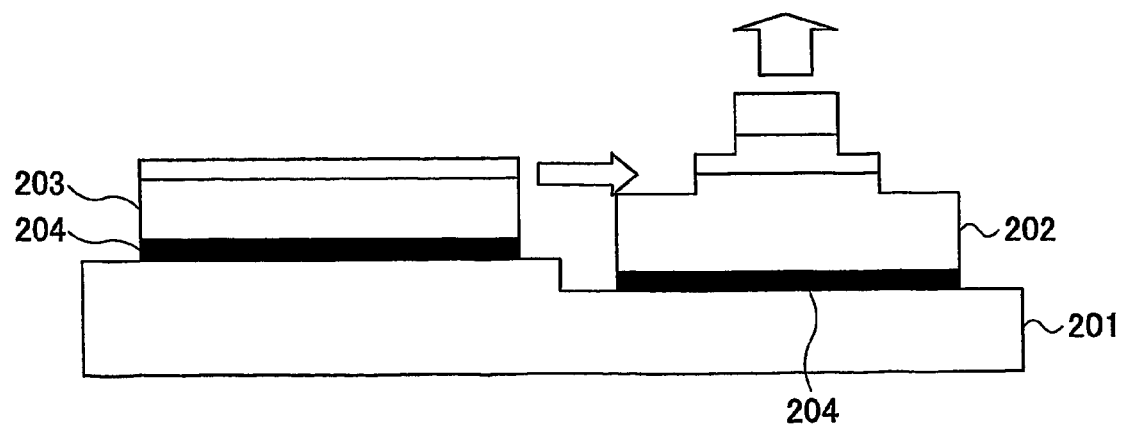
FIG. 2 is a schematic cross-sectional view illustrating an example of a light emission device, which includes the vertical cavity surface emitting semiconductor laser as shown in FIG. 1.

FIG. 2 is a schematic cross-sectional view illustrating an example of a light emission device, which includes the vertical cavity surface emitting semiconductor laser as shown in FIG. 1.

In this example, the same reference numbers are used for the same elements as those in the previous example, and overlapping descriptions being omitted.

As illustrated in FIG. 2, a VCSEL 202, as shown in FIG. 1, and an excitation semiconductor laser 203 are disposed on a silicon substrate 201. For example, the VCSEL 202 and the excitation semiconductor laser 203 are attached to the silicon substrate 201 by using a metal solder superior in thermal conductivity. For example, the excitation semiconductor laser 203 is a Fabry-Perot resonating semiconductor laser emitting a laser beam at a wavelength of 0.85 μm.

A step is formed on the silicon substrate 201 so that active layers of the excitation semiconductor laser 203 and the multiple quantum well second active region 104 formed from $GaAs/Al_{0.3}Ga_{0.7}As$ have nearly the same height.

The oscillation wavelength of the excitation semiconductor laser 203 is 0.85 μm, the same as the bandgap wavelength (0.85 μm) of the multiple quantum well second active region 104 formed from GaAs/Al$_{0.3}$Ga$_{0.7}$As of the VCSEL 202; hence, the second active region 104 of the VCSEL 202 can be optically excited to induce the VCSEL 202 to oscillate. Due to this, it is possible to increase the photon density in the VCSEL 202 while being in synchronization with the light in the VCSEL 202 generated by oscillation induced by current injection, and it is possible to increase the relaxation oscillation frequency fr of the VCSEL 202 As a result, by inputting a bias current and a modulation signal to the multiple quantum well active region 106 of the VCSEL 202, the light emission device of the present example is capable of large capacity optical transmission over 10 Gbps.

With the semiconductor laser 203, acting as the external excitation light source, being integrated on the silicon substrate 201, the light emission device of the present example can be made compact.

EXAMPLE 3

Figure 3:
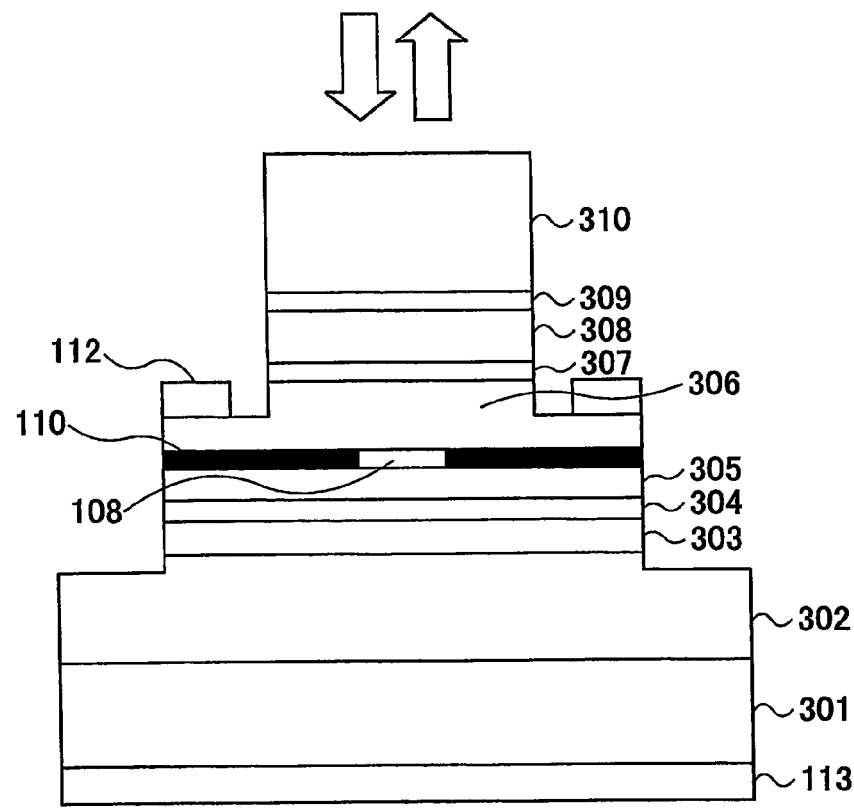
FIG. 3 is a schematic cross-sectional view illustrating another example of the vertical cavity surface emitting semiconductor laser (VCSEL) according to the present invention.

FIG. 3 is a schematic cross-sectional view illustrating another example of the vertical cavity surface emitting semiconductor laser (VCSEL) according to the present invention.

As illustrated in FIG. 3, an n-type distributed Bragg reflection mirror (DBR) 302 is disposed on an n-type GaAs substrate 301.

The n-type distributed Bragg reflection mirror (DBR) 302 is formed by alternately stacking an n-type GaAs layer and an n-type Al$_{0.9}$Ga$_{0.1}$As layer, each of which has a thickness of ¼ wavelength.

In addition, a first spacer layer 303 formed from GaAs, a multiple quantum well active region 304 formed from GaInNAs/GaAs, acting as the first active region, a second spacer layer 305 formed from GaAs, a p-type AlAs layer 108, a third spacer layer 306 formed from p-type GaAs, a multiple quantum well active region 307 formed from GaInNAs/GaAs, acting as the second active region, a fourth spacer layer 308 formed from GaAs, a multiple quantum well active region 309 formed from GaInNAs/GaAs, acting as a third active region, and a non-doped DBR 310 are stacked sequentially on the n-type distributed Bragg reflection mirror (DBR) 302.

Here, the non-doped DBR 310 is formed by alternately stacking a non-doped GaAs layer and a non-doped Al$_{0.9}$Ga$_{0.1}$As layer, each of which has a thickness of ¼ wavelength.

The stacked structure is etched from the top surface thereof up to the middle of the third spacer layer 306 to make the etched portion of the stacked structure a cylindrical shape, thereby forming a first mesa structure. In addition, the stacked structure is further etched up to the n-type distributed Bragg reflection mirror (DBR) 302 to make the etched portion of the stacked structure a rectangular shape, thereby forming a second mesa structure larger than the first mesa structure.

The p-type AlAs layer 108 is selectively oxidized from a side surface of the second mesa structure, thereby forming an AlO$_x$ insulating region 110.

A p-side electrode 112 is formed on the bottom of the first mesa structure (the top of the second mesa structure), and an n-side electrode 113 is formed on the back surface of the n-type GaAs substrate 301.

In the VCSEL illustrated in FIG. 3, holes injected from the p-side electrode 112 and electrons injected from the n-side electrode 113 recombine and result in light emission in the multiple quantum well first active region 304 formed from GaInNAs/GaAs, hence emitting light at a wavelength of 1.3 μm. At this moment, since the current is blocked by the AlO$_x$ insulating region 110, the current is concentrated beneath the portion of the p-type AlAs layer 108 not being selectively oxidized, hence the current distribution is narrowed.

The light emitted from the first active region 304 resonates in the resonator between the n-type distributed Bragg reflection mirror (DBR) 302 and the non-doped DBR 310, and a laser beam is emitted upward perpendicular to the substrate.

According to the present embodiment, in addition to the multiple quantum well first active region 304 formed from GaInNAs/GaAs, which emits light due to current injection, the VCSEL includes the multiple quantum well second active region 307 formed from GaInNAs/GaAs, and the multiple quantum well third active region 309 formed from GaInNAs/GaAs. The multiple quantum well second active region 307 and the multiple quantum well third active region 309 do not have electrodes for injecting currents.

With the excitation light being continuously injected from the outside to the second active region 307 and the third active region 309 through an light outgoing portion of the VCSEL, the VCSEL oscillates due to the external excitation light and emits a laser beam at a wavelength of 1.3 μm.

With the excitation light being continuously injected into the second active region 307 and the third active region 309 to induce oscillation in the second active region 307 and the third active region 309, by modulating the injection current flowing in the first active region 304, the carrier density in the first active region 304 changes, and the intensity of output laser is modulated. Thus, the photon density in the second active region 307 and the third active region 309 generated by the external excitation light are added at the same mode to the photon density generated in the first active region 304 by current injection. Hence, the photon density in the VCSEL can be increased, and it is possible to increase the relaxation oscillation frequency fr of the VCSEL, and attain high speed modulation.

In this example, because there are two active layers, which are excited by light from the outside, the density of carriers stored in each of the active layers can be lowered. Therefore, compared to the VCSEL in the first example, gain saturation can hardly occur even at a high photon density; hence, it is possible to further increase the relaxation oscillation frequency.

In addition, it is not necessary to form pn junctions in the second active region 307 and the third active region 309, which are excited by external excitation light and emit light. Therefore, there are, fewer limitations to the positions to form the active layers.

In FIG. 3, it is illustrated that plural active regions are provided in the resonator, but the optically excited active regions may be provided in the DBR 302. Alternatively, plural resonators coupled with each other may be constructed, and the optically excited active regions may be provided in each of the resonators. In this situation, in order to increase the coupling efficiency between light in the VCSEL and the active layers, it is preferable that the active regions be provided at anti-node positions of the optical standing wave distribution in the VCSEL.

Although the number of the active regions is increased, because it is not necessary to provide electrode terminals for current injection, the fabrication process does not become complicated.

In this example, the active regions are formed from GaInNAs, which is a mixed crystalline semiconductor of nitrogen and a group-V element (As). Hence, the active regions, which emit light at a band of 1.3 µm, can be epitaxially grown on the GaAs substrate 301. It is known that dispersion in a silica optical fiber becomes zero at a wavelength of 1.31 µm. Therefore, with the VCSEL of this example, it is possible to construct an optical transmission system involving less transmission limitations caused by the dispersion even at a transmission speed over 10 Gbps.

EXAMPLE 4

Figure 4:
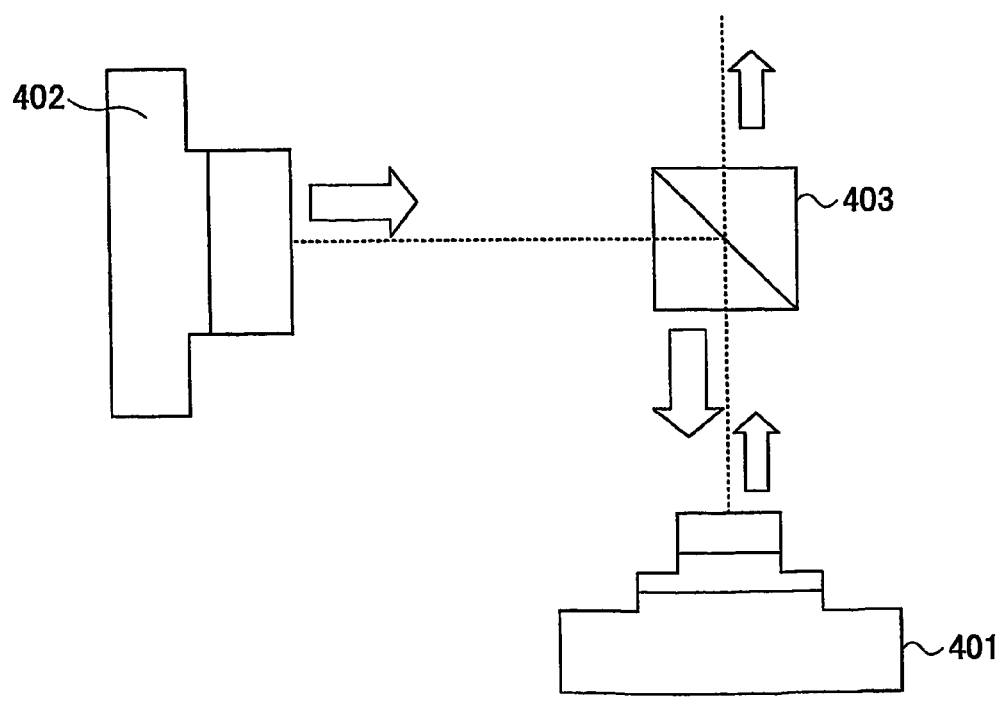
FIG. 4 is a schematic cross-sectional view illustrating an example of a light emission device including the vertical cavity surface emitting semiconductor laser as shown in FIG. 3.

FIG. 4 is a schematic cross-sectional view illustrating an example of a light emission device including the vertical cavity surface emitting semiconductor laser as shown in FIG. 3.

In this example, the same reference numbers are used for the same elements as those in the previous examples, and overlapping descriptions being omitted.

As illustrated in FIG. 4, a VCSEL 402 for use of excitation emits a continuous laser beam, and the output laser beam enters a polarized beam splitter 403. The polarization direction of the light from the VCSEL 402 is set such that the light can be reflected on the polarized beam splitter 403, thereby, the light-output from the VCSEL 402 is bent by 90 degrees, and is incident on an exit plane of a VCSEL 401, which is the same as that shown in FIG. 3. The oscillation wavelength of the VCSEL 402 is 0.98 µm.

Because the oscillation wavelength of the VCSEL 402 for excitation is shorter than the oscillation wavelengths of 1.31 µm of the multiple quantum well second active region 307 formed from GaInNAs/GaAs and the multiple quantum well third active region 309 formed from GaInNAs/GaAs of the VCSEL 402, the second active region 307 and the third active region 309 can be optically excited to induce oscillation in the second active region 307 and the third active region 309. Due to this, it is possible to increase the photon density in the VCSEL 401 while being in synchronization with the light in the VCSEL 401 generated by oscillation induced by current injection, and it is possible to increase the relaxation oscillation frequency fr of the VCSEL 401

The polarization direction of the modulation optical signal output from the VCSEL 401 is set such that the light can pass through the polarized beam splitter 403; thus, the light output from the VCSEL 401 is emitted upward without being reflected.

According to the light emission device including the VCSEL having an increased relaxation oscillation frequency, it is possible to realize large capacity transmission over 10 Gbps.

In addition, because the external excitation light source is a vertical cavity vertical cavity surface emitting semiconductor laser, it is possible to reduce power consumption of the light emission device, and reduce cost of the light emission device.

EXAMPLE 5

Figure 5A:
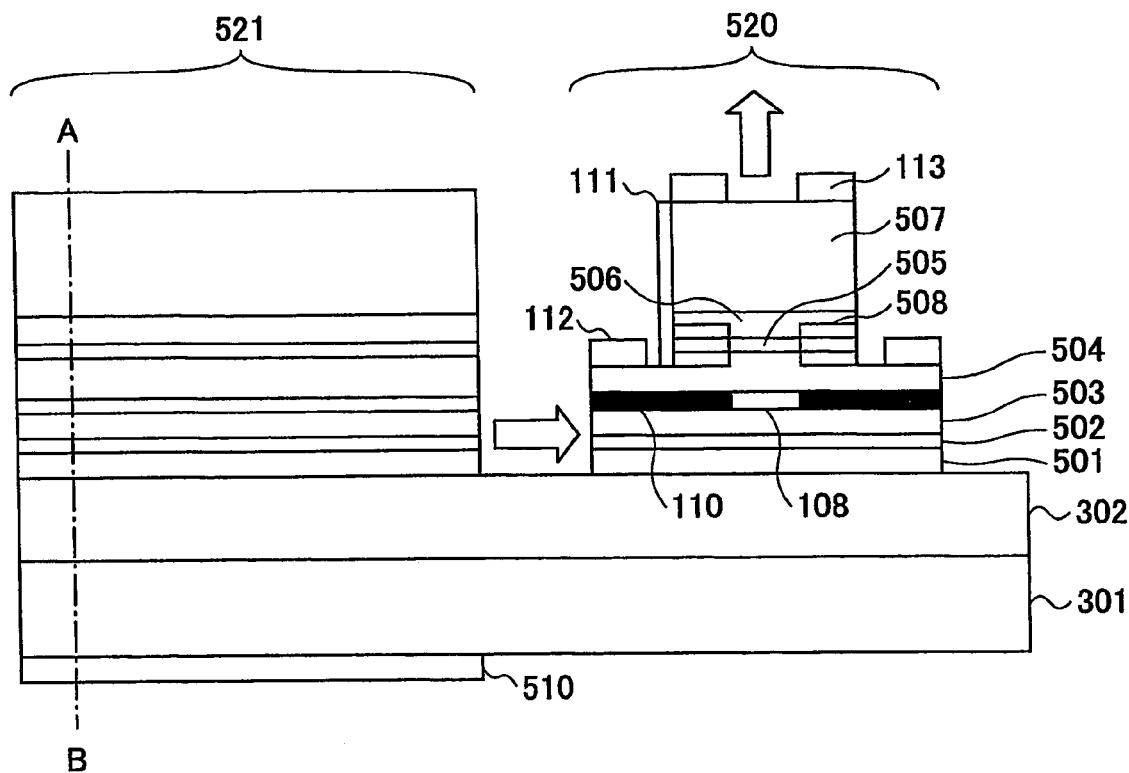
FIG. 5A is a schematic cross-sectional view illustrating another example of the vertical cavity surface emitting semiconductor laser (VCSEL) according to the present invention.

FIG. 5A is a schematic cross-sectional view illustrating another example of the vertical cavity surface emitting semiconductor laser (VCSEL) according to the present invention.

In this example, the same reference numbers are used for the same elements as those in the previous examples, and overlapping descriptions being omitted.

As illustrated in FIG. 5A, an n-type distributed Bragg reflection mirror (DBR) 302 is disposed on an n-type GaAs substrate 301.

The n-type distributed Bragg reflection mirror (DBR) 302 is formed by alternately stacking an n-type GaAs layer and an n-type $Al_{0.9}Ga_{0.1}As$ layer, each of which has a thickness of ¼ wavelength.

A first spacer layer 501 formed from GaAs, a multiple quantum well second active region 502 formed from GaInNAs/GaAs, a second spacer layer 503 formed from GaAs, a p-type AlAs layer 108, a third spacer layer 504 formed from p-type GaAs, a multiple quantum well first active region 505 formed from GaInNAs/GaAs, a fourth spacer layer 506 formed from GaAs, and a n-type DBR 507 are stacked sequentially on the n-type distributed Bragg reflection mirror (DBR) 302.

Here, the n-type DBR 507 is formed by alternately stacking a n-type GaAs layer and a n-type $Al_{0.9}Ga_{0.1}As$ layer, each of which has a thickness of ¼ wavelength.

In the example shown in FIG. 5A, a VCSEL 520 for generating modulation optical signals and a semiconductor laser 521 for excitation are integrated together on the n-type GaAs substrate 301.

In the VCSEL 520, the stacked structure is etched from the top surface thereof up to the middle of the third GaAs spacer layer 504 to make the etched portion of the stacked structure a cylindrical shape, thereby forming a first mesa structure. In addition, the stacked structure is further etched up to the n-type distributed Bragg reflection mirror (DBR) 302 to make the etched portion of the stacked structure a rectangular shape, thereby forming a second mesa structure larger than the first mesa structure.

The p-type AlAs layer 108 is selectively oxidized from a side surface of the second mesa structure, thereby forming an $AlO_x$ insulating region 110.

Protons are implanted in the area near the first active layer 505 except for the center portion, and a high resistance region 508 is formed.

An n-side ring electrode 113 is formed on the top of the first mesa structure except for a light outgoing portion. A p-side electrode 112 is formed on the bottom of the first mesa structure (the top of the second mesa structure).

A light-shielding layer 111 is arranged on the side surface of the first mesa structure The semiconductor laser 521 for excitation is arranged to be close to and beside the VCSEL 520, forming a Fabry-Perot resonating semiconductor laser with an edge reflection mirror being formed by etching.

Figure 5B:
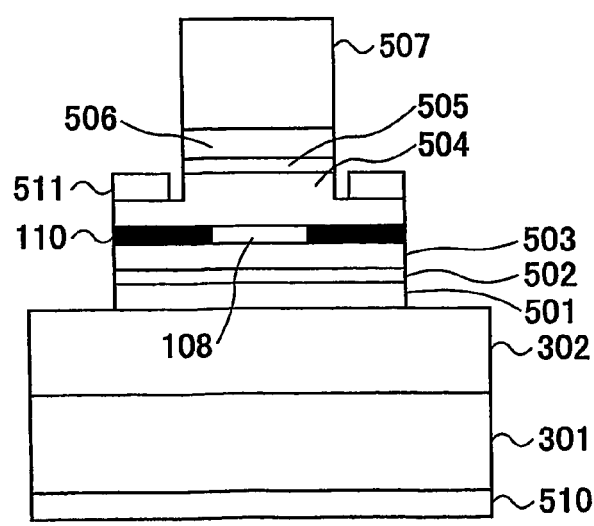
FIG. 5B is a schematic cross-sectional view illustrating the semiconductor laser 521 along the A-B line in FIG. 5A.

FIG. 5B is a schematic cross-sectional view illustrating the semiconductor laser 521 along the A-B line in FIG. 5A.

The stacked structure illustrated in FIG. 5B, is the same as the VCSEL 520 in FIG. 5A.

The stacked structure in FIG. 5B is etched from the top surface thereof up to the middle of the third GaAs spacer layer 504 to form a first ridge stripe structure. In addition, the stacked structure is further etched up to the n-type distributed Bragg reflection mirror (DBR) 302 to form a second ridge stripe structure having a width greater than the first ridge stripe structure.

The p-type AlAs layer 108 is selectively oxidized from a side surface of the second ridge stripe structure, thereby forming an $AlO_x$ insulating region 110.

A p-side electrode 511 is formed on the bottom of the first ridge stripe structure (the top of the second ridge stripe structure), and an n-side electrode 510 is formed on the back surface of the n-type GaAs substrate 301.

In the semiconductor laser 521, which is used for excitation, a current injected from the p-side electrode 511 is concentrated to a center portion of the ridge stripe structure due to the $AlO_x$ insulating region 110, and is injected into the multiple quantum well second active region 502 formed from GaInNAs/GaAs, and emits light at a wavelength of 1.3 µm.

The n-type distributed Bragg reflection mirror (DBR) 302 and the n-type DBR 507 function as clad layers, confining light in the perpendicular direction.

Because the $AlO_x$ insulating region 110 which is selectively oxidized has a lower refractive index than the portion of the p-type AlAs layer 108 which is not selectively oxidized, a difference of the refractive index in the horizontal direction results. Because of the difference of the refractive index of the $AlO_x$ insulating region 110 in the horizontal direction and the first ridge stripe structure, light is confined also in the horizontal direction.

Light resonates between a pair of edge reflection mirrors formed by dry etching, and the oscillating laser is extracted in the horizontal direction.

On the other hand, in the VCSEL 520, holes injected from the p-side electrode 112 and electrons injected from the n-side electrode 113 recombine and result in light emission in the multiple quantum well first active region 505 formed from GaInNAs/GaAs hence, emitting light at a wavelength of 1.3 µm. At this moment, the current is concentrated in a mesa center by the high resistance region 508. Because of a difference of the refractive indexes of the $AlO_x$ insulating region 110 and the p-type AlAs layer 108, light is confined in the horizontal direction, and this reduces refraction loss.

The light emitted from the first active region 505 resonates in the resonator between the n-type distributed Bragg reflection mirror (DBR) 302 and the n-type DBR 507, and a laser beam is emitted upward perpendicular to the substrate.

As described above, in addition to the multiple quantum well first active region 505 formed from GaInNAs/GaAs, which emits light due to current injection, the VCSEL 520 includes the multiple quantum well second active region 502 formed from GaInNAs/GaAs without a current injection mechanism. The second active region 502 of the VCSEL 520 has the same height as the active region 502 of the neighboring semiconductor laser 521; thus, the external excitation light can be injected from the side surface of the second mesa structure into the second active region 502.

With the excitation light generated by the semiconductor laser 521 being continuously injected to the second active region 502, a laser beam is emitted from the second active region 502 having a wavelength corresponding to a bandgap of the second active region 502 at 1.3 µm. When the intensity of the excitation light is increased to be over a specified threshold value, optically-excited laser oscillation occurs in the VCSEL 520.

With the excitation light being continuously injected to the second active region 502 to induce oscillation in the second active region 502, by modulating the injection current flowing in the first active region 505, the carrier density in the first active region 505 changes, and the intensity of output laser is modulated. Thus, the photon density in the second active region 502 generated by the external excitation light is added at the same mode to the photon density generated in the first active region 505 by current injection. Hence, the photon density in the VCSEL 520 can be increased, and it is possible to increase the relaxation oscillation frequency fr of the VCSEL 520, and attain high speed modulation.

According to the light emission device of this example, because the VCSEL 520 for generating modulation optical signals and the semiconductor laser 521 for excitation are integrated together on the same n-type GaAs substrate 301, it is possible to make the light emission device more compact, reduce the number of parts in the light emission device, simplify the mounting and assembly process, and reduce cost of the light emission device.

EXAMPLE 6

Figure 6:
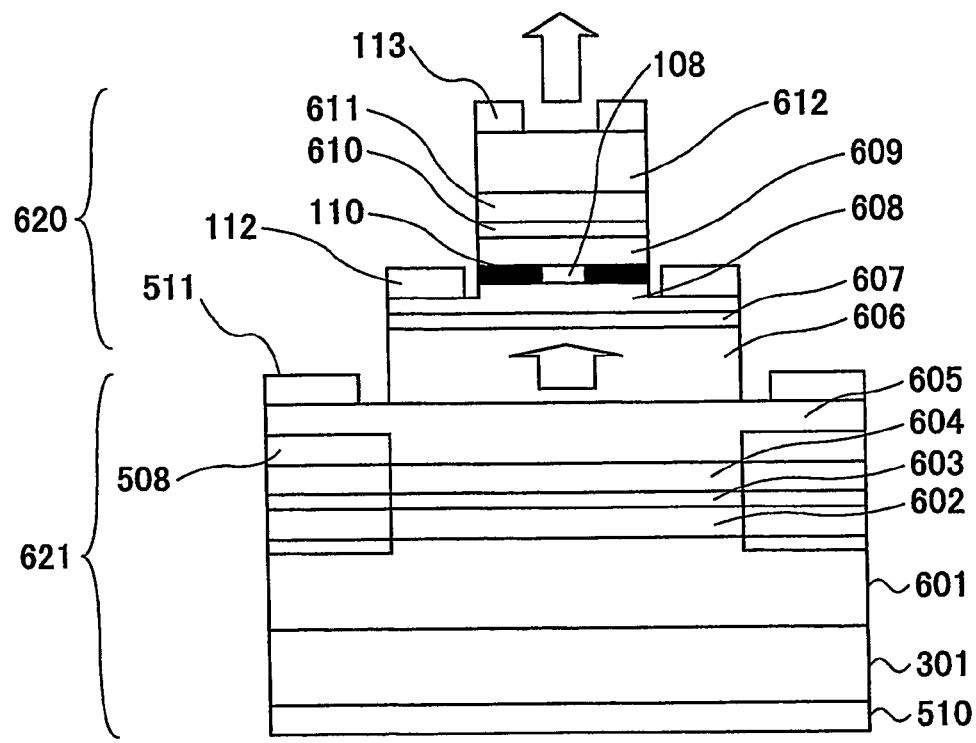
FIG. 6 is a schematic cross-sectional view illustrating another example of the vertical cavity surface emitting semiconductor laser (VCSEL) according to the present invention.

FIG. 6 is a schematic cross-sectional view illustrating another example of the vertical cavity surface emitting semiconductor laser (VCSEL) according to the present invention.

As illustrated in FIG. 6, an n-type distributed Bragg reflection mirror (DBR) 601 is disposed on an n-type GaAs substrate 301.

The n-type distributed Bragg reflection mirror (DBR) 601 is formed by alternately stacking an n-type GaAs layer and an n-type $Al_{0.9}Ga_{0.1}As$ layer, each of which has a thickness of ¼ wavelength (wavelength: 0.98 µm).

In addition, a first spacer layer 602 formed from $Al_{0.2}Ga_{0.8}As$, a multiple quantum well active region 603 formed from GaInAs/GaAs, a second spacer layer 604 formed from $Al_{0.2}Ga_{0.8}As$, and a p-type DBR 605 are stacked sequentially on the n-type distributed Bragg reflection mirror (DBR) 601.

Here, the p-type DBR 605 is formed by alternately stacking a p-type GaAs layer and a p-type $Al_{0.9}Ga_{0.1}As$ layer, each of which has a thickness of ¼ wavelength (wavelength: 0.98 µm)

In addition, a non-doped DBR 606 is deposited on the p-type DBR 605.

Here, the non-doped DBR 606 is formed by alternately stacking a none-doped GaAs layer and a none-doped $Al_{0.9}Ga_{0.1}As$ layer, each of which has a thickness of ¼ wavelength (wavelength: 1.3 µm).

In addition, a multiple quantum well second active region 607 formed from GaInNAs/GaAs, a first spacer layer 608 formed from p-type GaAs, a p-type AlAs layer 108, a second spacer layer 609 formed from GaAs, a multiple quantum well first active region 610 formed from GaInNAs/GaAs, a third spacer layer 611 formed from GaAs, and a n-type DBR 612 are stacked sequentially on the non-doped DBR 606.

Here, the n-type DBR 612 is formed by alternately stacking a n-type GaAs layer and a n-type $Al_{0.9}Ga_{0.1}As$ layer, each of which has a thickness of ¼ wavelength (wavelength: 1.3 µm).

The stacked structure is etched from the top surface thereof up to the middle of the first spacer layer 608 formed from p-type GaAs to make the etched portion of the stacked structure a cylindrical shape, thereby forming a first mesa structure. In addition, the stacked structure is further etched up to the p-type distributed Bragg reflection mirror (DBR) 605 to make the etched portion of the stacked structure a cylindrical shape, thereby forming a second mesa structure larger than the first mesa structure.

The p-type AlAs layer 108 is selectively oxidized from a side surface of the first mesa structure, thereby, forming an $AlO_x$ insulating region 110.

Protons are implanted in the area near the multiple quantum well active region 603 formed from GaInAs/GaAs, except for the portion below the second mesa structure, and a high resistance region 508 is formed.

An n-side ring electrode 113 is formed on the top of the first mesa structure except for a light outgoing portion. A p-side electrode 112 is formed on the bottom of the first mesa structure (the top of the second mesa structure). A p-side electrode 511 is formed on the bottom of the second mesa structure. An n-side electrode 510 is formed on the back surface of the n-type GaAs substrate 301.

In the light emission device shown in FIG. 6, a VCSEL 620 for generating modulation optical signals and a VCSEL 621 for excitation are integrated together on the n-type GaAs substrate 301. Specifically, the n-type distributed Bragg reflection mirror (DBR) 601, the first spacer layer 602, the multiple quantum well active region 603 formed from GaInAs/GaAs, the second spacer layer 604 formed from $Al_{0.2}Ga_{0.8}As$, and the p-type DBR 605 constitute the VCSEL 621 for excitation, and the non-doped DBR 606, the multiple quantum well-second active region 607 formed from GaInNAs/GaAs, the first spacer layer 608 formed from p-type GaAs, the p-type AlAs layer 108, the second spacer layer 609 formed from GaAs, the multiple quantum well first active region 610 formed from GaInNAs/GaAs, the third spacer layer 611 formed from GaAs, and the n-type DBR 612 constitute the VCSEL 620 for generating modulation optical signals.

In the VCSEL 621, which is used for excitation, holes injected from the p-side ring electrode 511 and electrons injected from the n-side electrode 510 recombine in the multiple quantum well active region 603 formed from GaInAs/GaAs, resulting in emission of light at a wavelength of 0.98 μm in the active region 603. At this moment, the current is concentrated in the mesa center by the high resistance region 508. The light emitted from the multiple quantum well active region 603 formed from GaInAs/GaAs resonates in the resonator between the n-type distributed Bragg reflection mirror (DBR) 601 and the p-type DBR 605, and a laser beam is emitted upward perpendicular to the substrate.

On the other hand, in the VCSEL 620 for generating modulation optical signals, holes injected from the p-side electrode 112 and electrons injected from the n-side electrode 113 recombine, resulting in emission of light at a wavelength of 1.3 μm in the multiple quantum well second active region 607 formed from GaInNAs/GaAs. At this moment, the multiple quantum well second active region 607 is excited by the light beam at 0.98 μm from the VCSEL 621 below the second active region 607, and light is emitted from the second active region 607 having a wavelength corresponding to a bandgap of the second active region 607 at 1.3 μm. When the intensity of the excitation light is increased to be over a specified threshold value, laser oscillation occurs in the VCSEL 620 due to optical excitation.

With the excitation light generated by the excitation VCSEL 621 being continuously injected into the second active region 607 to induce oscillation in the second active region 607, by modulating the current to be injected into the first active region 610, the carrier density in the first active region 610 changes, and the intensity of output laser is modulated. Thus, the photon density in the second active region 607 generated by the external excitation light is added at the same mode to the photon density generated in the first active region 610 by current injection. Hence, the photon density in the VCSEL 620 can be increased, and it is possible to increase the relaxation oscillation frequency fr of the VCSEL 620, and attain high speed modulation.

In addition, the multiple quantum well first active region 610 formed from GaInNAs/GaAs is doped with p-type impurities, for example, C, at a concentration of $8 \times 10^{18}$ $cm^{-3}$.

Due to this, the density of electrons required to be injected for laser oscillation decreases, and a differential gain g increases. As a result, it is possible to further increase the relaxation oscillation frequency of the VCSEL device by a factor of 1.5. Due to this effect, it is possible for the VCSEL 620, which generates modulation optical signals, to generate optical signals at 40 Gbps by direct modulation.

Because the VCSEL 620 for generating modulation optical signals and the VCSEL 621 for excitation are integrated together on the same n-type GaAs substrate, it is possible to make the light emission device more compact, reduce the number of parts in the light emission device, and reduce cost of the light emission device.

Because there are no external modulators or optical image-forming elements, it is possible to reduce the number of parts in the light emission device, simplify the mounting and assembly process, and reduce cost of the light emission device.

Further, even when the environmental temperature changes, because in the VCSEL 620 the laser oscillation induced by optical excitation and the laser oscillation induced by current excitation are always in synchronization with each other, it is not necessary to perform accurate temperature control in order to improve the relaxation oscillation frequency. Due to this, it is possible to construct a light emission device at low cost without electron cooling devices.

EXAMPLE 7

Figure 7:
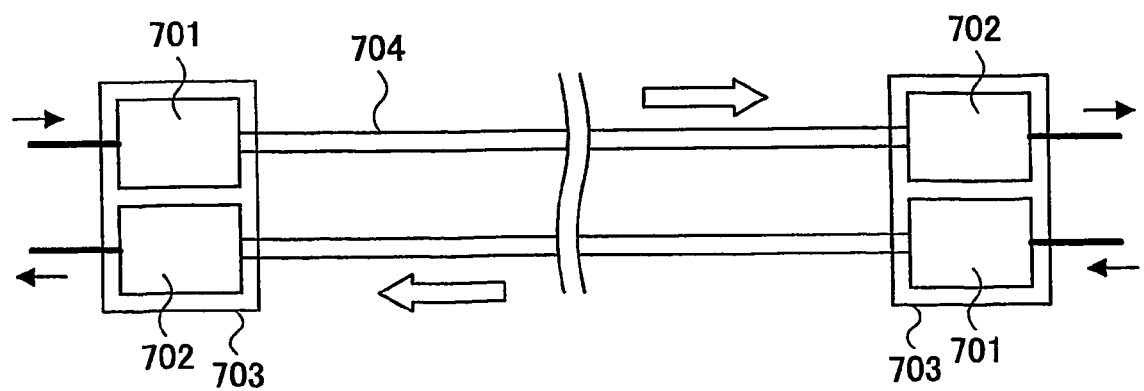
FIG. 7 is a schematic view illustrating an optical transmission system according to the present invention.

FIG. 7 is a schematic view illustrating an optical transmission system according to the present invention.

As illustrated in FIG. 7, the optical transmission system includes an optical transmitting section 701, an optical reception section 702, and optical fiber cable 704.

The optical transmitting section 701 converts electrical signals to optical signals, and transmits the optical signals to the optical fiber cable 704.

The optical fiber cable 704 guides the optical signals. The optical fiber cable 704 includes two transmission lines for transmission and reception, respectively, and is capable of bi-directional communication.

The optical reception section 702 converts the optical signals to electrical signals.

The optical transmitting section 701 and the optical reception section 702 are accommodated in one package, and this package is called optical transmission and reception module 703.

For example, the light emission device as described in FIG. 6 is used as the light source in the optical transmitting section 701 of the optical transmission system in FIG. 7.

The light emission device in FIG. 6 is able to increase the relaxation oscillation frequency, and capable of signal transmission at 40 Gbps with external modulators.

Because it is not necessary to perform accurate temperature control with electron cooling devices, the light emission device can be constructed at low cost. Hence, it is possible to construct an optical transmission system capable of optical transmission at 40 Gbps at low cost.

EXAMPLE 8

Figure 8:
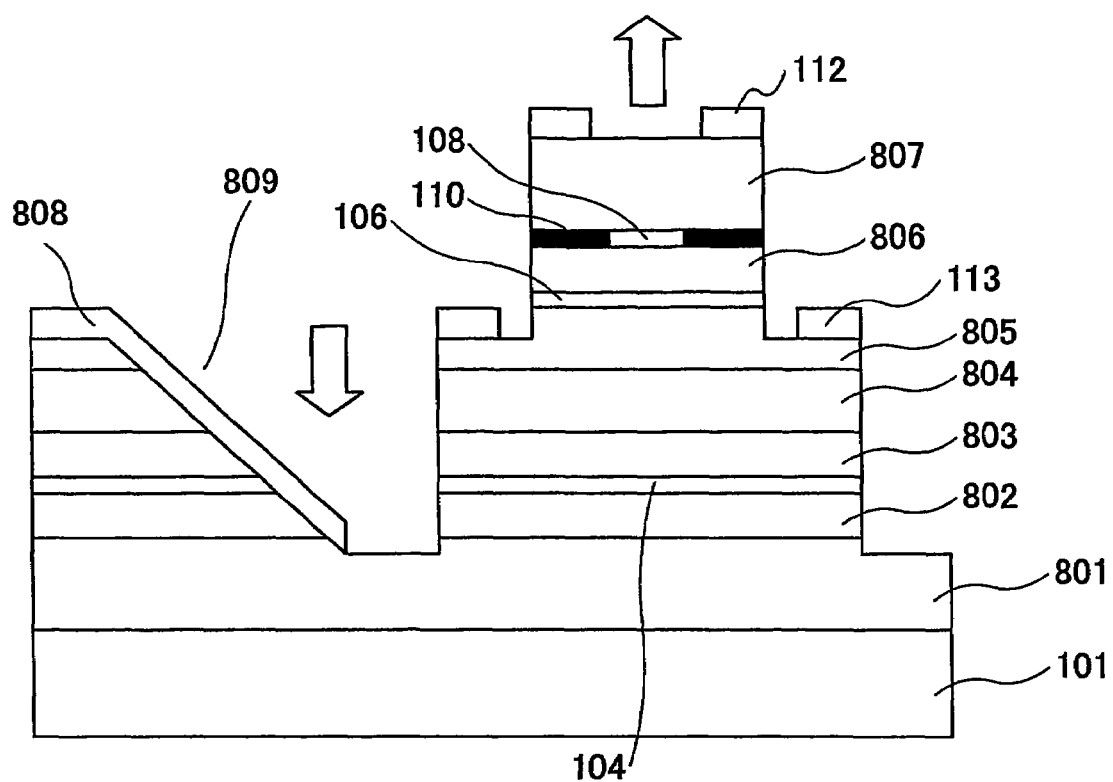
FIG. 8 is a schematic cross-sectional view illustrating an example of the vertical cavity surface emitting semiconductor laser (VCSEL) according to the present invention.

FIG. 8 is a schematic cross-sectional view illustrating an example of the vertical cavity surface emitting semiconductor laser (VCSEL) according to the present invention.

As illustrated in FIG. 8, a non-doped first distributed Bragg reflection mirror (DBR) 801 is disposed on a semi-insulating GaAs substrate 101.

The non-doped distributed Bragg reflection mirror (DBR) 801 is formed by alternately stacking a non-doped $Al_{0.2}Ga_{0.8}As$ layer and a non-doped $Al_{0.9}Ga_{0.1}As$ layer, each of which has a thickness of ¼ wavelength.

In addition, a first spacer layer 802 formed from $Al_{0.3}Ga_{0.7}As$, a multiple quantum well active region 104 formed from $GaAs/Al_{0.3}Ga_{0.7}$ As, acting as the second active region, a second spacer layer 803 formed from n-type $Al_{0.3}Ga_{0.7}As$, and a non-doped second DBR 804 are stacked sequentially on the non-doped distributed Bragg reflection mirror (DBR) 801.

Here, the non-doped second DBR 804 is formed by alternately stacking a non-doped $Al_{0.2}Ga_{0.8}As$ layer and a non-doped $Al_{0.9}Ga_{0.1}As$ layer, each of which has a thickness of ¼ wavelength. The period of the stacked structure is less than the non-doped first DBR 801.

In addition, a third spacer layer 805 formed from n-type $Al_{0.3}Ga_{0.7}As$, a multiple quantum well active region 106 formed from $GaAs/Al_{0.3}Ga_{0.7}As$, acting as the first active region, a fourth spacer layer 806 formed from $Al_{0.3}Ga_{0.7}As$, a p-type AlAs layer 108, and a p-type DBR 807 are stacked sequentially on the non-doped second DBR 804.

Here, the p-type DBR 807 is formed by alternately stacking a p-type $Al_{0.2}Ga_{0.8}As$ layer and a p-type $Al_{0.9}Ga_{0.1}As$ layer, each of which has a thickness of ¼ wavelength.

The stacked structure is etched from the top surface thereof up to the middle of the third spacer layer 805 to make the etched portion of the stacked structure a cylindrical shape, thereby forming a first mesa structure. In addition, the stacked structure is further etched up to the non-doped distributed Bragg reflection mirror (DBR) 801 to make the etched portion of the stacked structure a cylindrical shape, thereby forming a second mesa structure larger than the first mesa structure.

The p-type AlAs layer 108 is selectively oxidized from a side surface of the first mesa structure, thereby, forming an $AlO_x$ insulating region 110.

A p-side ring electrode 112 is formed on the p-type DBR 807 except a light outgoing portion, and an n-side electrode 113 is formed on the bottom of the first mesa structure (the top of the second mesa structure).

A 45° reflection mirror 809 is arranged adjacent to one side of the second mesa structure, and a high reflectivity film 808 is disposed on the surface of the reflection mirror 809. The high reflectivity film 808 may be a metal film with an insulating film, or a dielectric multilayer film.

In the VCSEL in FIG. 8, there are a first resonator sandwiched by the non-doped first DBR 801 and the non-doped second DBR 804, a second resonator sandwiched by the non-doped second DBR 804 and the p-type DBR 807. The Bragg reflection wavelengths of the non-doped first DBR 801, the non-doped second DBR 804, and the non-doped second DBR 804 and the p-type DBR 807 are all 0.85 μm. In addition, it is designed that the length of each of the resonators equals an integral multiple of an optical distance equivalent to 0.85 μm. The stacking period of the non-doped second DBR 804 is 10, which is less than the stacking period of the non-doped DBR 801; thereby, the two resonators optically couple with each other and form a resonance mode.

In the VCSEL illustrated in FIG. 8, holes injected from the p-side ring electrode 112 and electrons injected from the n-side electrode 113 recombine and result in light emission in the multiple quantum well first active region 106 formed from $GaAs/Al_{0.3}Ga_{0.7}As$ in the first resonator, hence, emitting light at a wavelength of 0.85 μm. At this moment, since the current is blocked by the $AlO_x$ insulating region 110, the current is concentrated beneath the portion of the p-type AlAs layer 108 not being selectively oxidized, hence the current distribution is narrowed.

The light emitted from the first active region 106 resonates in the compound resonator obtained by coupling the non-doped first DBR 801, the non-doped second DBR 804, and the p-type DBR 807, and a laser beam is emitted upward perpendicular to the substrate.

The external excitation light is reflected on the 45° reflection mirror 809, and is incident on the second active region 104 provided in the first resonator from a side surface of the second mesa structure. With the excitation light being continuously injected into the second active region 104, light is emitted from the second active region 104 having a wavelength corresponding to a bandgap of the second active region 104 at 0.85 μm. When the intensity of the excitation light is increased to be over a specified threshold value, optically-excited laser oscillation occurs in the VCSEL.

Because the first active region 106 has the same bandgap as the second active region 104, and the first active region 106 and the second active region 104 couple with each other to form the same resonance mode, the light generated by oscillation induced by current injection into the first active region 106 and the light generated by oscillation induced by optically exciting the second active region 104 have the same wavelength.

With the excitation light being continuously injected into the second active region 104 to induce oscillation in the second active region 104, by modulating the injection current to the first active region 106, the carrier density in the first active region 106 changes, and the intensity of output laser is modulated. Therefore, the photon density in the second active region 104 generated by the external excitation light is added at the same mode to the photon density generated in the first active region 106 by current injection. Hence, the photon density in the VCSEL can be increased, and it is possible to increase the relaxation oscillation frequency fr of the VCSEL, and attain high speed modulation.

Because the first active region 106 and the second active region 104 are arranged to sandwich the non-doped second DBR 804 and are in different resonators, the external excitation light reflected from the 45° reflection mirror 809 selectively excites the second active region 104, but does not leak off to the first active region 106, to generate a coupling with the first active region 106. As a result, with the external excitation light, it is possible to increase the limit value of the current causing gain saturation in the first active region 106 without increasing the carrier density in the first active region 106. Therefore, it is possible to increase a signal-to-noise (S/N) ratio of modulation optical signals generated by modulation electrical signals applied on the first active region 106.

While the present invention is above described with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Application No. 2004-118755 filed on Apr. 14, 2004.

The invention claimed is:

1. A vertical cavity surface emitting semiconductor laser, comprising:
   a resonator that is arranged on a substrate and includes a first active region able to emit light in response to injection of an electrical current therein and a second active region able to emit light in response to external excitation light; and
   a plurality of multilayer film reflecting mirrors which mirrors sandwich the resonator from two opposite sides, respectively;
   wherein both the first active region and the second active region have gains at a wavelength the same as a resonance mode of the resonator.

2. A vertical cavity surface emitting semiconductor laser, comprising:
   a plurality of resonators that are arranged on a substrate and optically coupled with each other to form a resonance mode, one of the resonators having a first active region able to emit light in response to injection of an electrical current, each of the other resonators having a second active region able to emit light in response to external excitation light; and
   a plurality of multilayer film reflecting mirrors which mirrors sandwich the resonators from two opposite sides, respectively;
   wherein the first active region and the second active regions have gains at a wavelength the same as the resonance mode.

3. The vertical cavity surface emitting semiconductor laser as claimed in claim 1 or claim 2, wherein plural of the second active regions are provided.

4. The vertical cavity surface emitting semiconductor laser as claimed in any of claim 1 to claim 3, wherein each of the first active region and the second active regions includes a mixed crystalline semiconductor of nitrogen and group-V elements.

5. The vertical cavity surface emitting semiconductor laser as claimed in any of claim 1 to claim 4, wherein
   the first active region includes a multiple quantum well structure obtained by stacking plural quantum well layers and barrier layers, and
   each of the barrier layers is doped with p-type impurities at a concentration in a range from $1 \times 10^{18}$ cm$^{-3}$ to $1 \times 10^{19}$ cm$^{-3}$.

6. A light emission device, comprising:
   an external excitation light source; and
   a vertical cavity surface emitting semiconductor laser that includes a resonator that is arranged on a substrate and includes a first active region able to emit light in response to injection of an electrical current therein and a second active region able to emit light in response to external excitation light, the first active region and the second active region having gains at a wavelength the same as a resonance mode of the resonator, and plural multilayer film reflecting mirrors that sandwich the resonator from two opposite sides, respectively;
   wherein a wavelength of the external excitation light source is less than or equal to a wavelength corresponding to a bandgap of the second active region.

7. A light emission device, comprising:
   an external excitation light source; and
   a vertical cavity surface emitting semiconductor laser that includes a plurality of resonators that are arranged on a substrate and optically coupled with each other to form a resonance mode, one of the resonators having a first active region able to emit light in response to injection of an electrical current, each of the other resonators having a second active region able to emit light in response to external excitation light; and a plurality of multilayer film reflecting mirrors which mirrors sandwich the resonators from two opposite sides, respectively;
   wherein the first active region and the second active regions have gains at a wavelength the same as the resonance mode.

8. The light emission device as claimed in claim 6 or claim 7, wherein the external excitation light source is a semiconductor laser.

9. The light emission device as claimed in claim 8, wherein the external excitation light source is another vertical cavity surface emitting semiconductor laser.

10. The light emission device as claimed in claim 8 or claim 9, wherein the external excitation light source and the vertical cavity surface emitting semiconductor laser are integrated together.

11. An optical transmission system, comprising:
    a light emission device, which includes an external excitation light source; and
    a vertical cavity surface emitting semiconductor laser, which includes a resonator that is arranged on a substrate, which resonator includes a first active region able to emit light in response to injection of an electrical current therein and a second active region able to emit light in response to external excitation light, the first active region and the second active region having gains at a wavelength the same as a resonance mode of the resonator, and plural multilayer film reflecting mirrors that sandwich the resonator from two opposite sides, respectively;
    wherein a wavelength of the external excitation light source is less than or equal to a wavelength corresponding to a bandgap of the second active region.

12. An optical transmission system, comprising:
    a light emission device, which includes an external excitation light source; and
    a vertical cavity surface emitting semiconductor laser, which includes a plurality of resonators that are arranged on a substrate and optically coupled with each other to form a resonance mode, one of the resonators having a first active region able to emit light in response to injection of an electrical current, each of the other resonators having a second active region able to emit light in response to external excitation light; and a plurality of multilayer film reflecting mirrors which mirrors sandwich the resonators from two opposite sides, respectively;
    wherein the first active region and the second active regions have gains at a wavelength the same as the resonance mode.

* * * * *